United States Patent [19]

Donald et al.

[11] 3,742,259

[45] June 26, 1973

[54] ELECTRONIC BAND-PASS FILTER OR OSCILLATOR

[75] Inventors: Raymond George Donald, North Andover; Walter Richardson Spofford, Jr., Bedford; Daniel Ira Pomerantz, Lexington, all of Mass.

[73] Assignee: P. R. Mallory & Co. Inc., Indianapolis, Ind.

[22] Filed: Jan. 20, 1972

[21] Appl. No.: 219,577

Related U.S. Application Data

[63] Continuation of Ser. No. 6,380, Jan. 28, 1970, abandoned.

[52] U.S. Cl. .................................. 307/295, 307/299
[51] Int. Cl. .......................................... H03k 17/00
[58] Field of Search .............................. 328/167,150; 307/299, 295; 331/135

[56] References Cited

UNITED STATES PATENTS

| | | | |
|---|---|---|---|
| 3,427,559 | 2/1969 | Cricchi et al. | 307/299 |
| 3,175,158 | 3/1965 | Flesher | 328/167 X |

OTHER PUBLICATIONS

Active Filters Part 7, by J. Salemo, Electronics 2/69 pgs. 100–105.

*Primary Examiner*—John W. Huckert
*Assistant Examiner*—B. P. Davis
*Attorney*—Richard H. Childress, Robert F. Meyer et al.

[57] ABSTRACT

The disclosure is directed to an electronic band-pass filter having improved characteristics including high band-pass selectivity and a highly amplified output signal. The circuitry used in the filter system is particularly amenable to hybrid and/or monolythic integration, without the need for large external L-C components commonly found in present electronic filters. In the integrated form, the filter is easily adjusted for both selected frequency (fo) and gain and Q (figure of merit).

5 Claims, 7 Drawing Figures

INVENTORS
RAYMOND G. DONALD
WALTER R. SPOFFORD, JR.
DANIEL I. POMERANTZ
BY
C. Carter Ells INVENTORS
RAYMOND G. DONALD
WALTER R. SPOFFORD, JR.
DANIEL I. POMERANTZ
BY
C. Carter Ells INVENTORS
RAYMOND G. DONALD
WALTER R. SPOFFORD, JR.
DANIEL I. POMERANTZ
BY
C. Carter Ells INVENTORS
RAYMOND G. DONALD
WALTER R. SPOFFORD, JR
DANIEL I. POMERANTZ
BY
C. Carter Ells INVENTORS
RAYMOND G. DONALD
WALTER R. SPOFFORD
DANIEL I. POMERANTZ
BY
C. Carter Ells

ELECTRONIC BAND-PASS FILTER OR OSCILLATOR

This is a continuation of application Ser. No. 6,380, filed 1/28/70 now abandonded.

The present invention relates to electronic filters, in general, and more specifically to a substantially integratable filter utilizing simple and nexpensive circuitry arrangements, the filter being readily useable with other integrated inexpensive conventional electronic circuitry in many various systems.

In conventional electrical filters, as for example those used in conjunction with typical FM-AM receiver systems, the filtering of specific frequency bands is usually accomplished with conventional L-C combinations which act as frequency sensitive phase shift elements to provide the filter with the necessary frequency selectivity required by the receiver unit. Typically, an L-C "can," or other type of conventional filter, is quite complex and costly compared to the instant electronic filter. An integrated version of the instant filter requires no inductors or capacitors as tuning elements, and therefore, has a definite size advantage as well. Obviously, since the trend in modern day electronics is to build smaller, more compact equipment, the need for micro-miniaturized filters becomes apparent. Such need is readily met by the integrated version of the electronic filter disclosed herein.

Another major advantage of the instant filter over its conventional counterparts is the substantial reduction in cost-per-unit which results from manufacturing such units using conventional integrated circuit techniques.

Still another advantage of the instant filter is that it greatly amplifies the selected signal at the resonant frequency. This is in contrast to conventional filters which generally attenuate the selected signal. Conventional filters require complex and expensive high gain amplifier circuitry to amplify the selected signal. The filter disclosed herein provides high gain without specifically having to construct high gain amplifier circuitry.

Further, the instant filter's frequency response curve possesses excellent symmetry with respect to the response at the resonant frequency and the phase shift characteristics are linear in the band-pass.

Another advantage is that, with a gain readjustment, the circuit can be made to oscillate at a predetermined frequency.

Attention is directed to the fact that (using present day techniques) inductors are not integratable at all, while capacitors are not conveniently integrated due to stringent specifications on space requirements and environmental stability on the I-C ship; hence, it is apparent that the electronic filter disclosed provides numerous advantages, such as those mentioned hereinbefore, over known conventional filters.

It is an object of the invention to provide a novel electronic filter which can be substantially integrated and furthermore is voltage tunable with simple biasing components such as an inexpensive potentiometer.

It is also an object of the invention to provide a novel electronic filter that inherently amplifies the input signal for frequencies in the filter band-pass.

Another object of the invention is to provide a novel electronic band-pass filter being greatly reduced in size relative to conventional fitlers, yet being readily useable in conjunction with both integrated and conventional electronic components.

Other features, advantages and objects of the invention will become apparent from a consideration of the following description when taken in conjunction with the accompanying drawings, in which.

Figure 1:
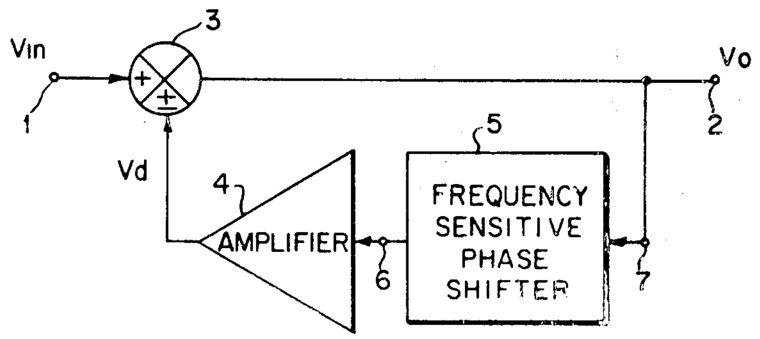
FIG. 1 is a block diagram illustrating basically the electronic band-pass filter.

Referring now to FIG. 1, the electronic band-pass filter is shown to be comprised of a summer 3 having an input terminal 1 to receive an input signal $V_{in}$. The output of summer 3 is connected to the input terminal 7 of a frequency sensitive phase shifter 5 while also being connected to an output terminal 2 to deliver a signal $V_o$. The output terminal 6 of frequency sensitive phase shifter 5 is shown connected to the input of amplifier 4, the latter of which has its output connected to an input of the summer 3 to receive signal $V_d$. The system of FIG. 1 is frequency selective in that it amplifies input signals at a predetermined frequency while rejecting input signals of certain other frequencies. In particular, when the frequency sensitive phase shifter 5 produces a signal $V_d$ which is either odd multiples of 180°, or all multiples of 360° out of phase with $V_{in}$ (depending upon the choice of minus or plus in the summer system), the system will produce a large output voltage at terminal 2. In the same way the return signal $V_d$ can be of such phase that it cancels $V_{in}$ to produce a resultant low output voltage $V_o$ at terminal 2. It should be noted that generally speaking, the signal passed through the frequency sensitive phase shifter 5 will be attenuated to some degree and that this signal is in turn amplified by amplifier 4 such that the signal $V_d$ is restored to a value nearly equal to the value of the signal received at terminal 7. (A further refinement can be realized by restoring the amplitude of $V_d$ to a value equal to or slightly *greater* in smplitude than the original signal, $V_{in}$. For this case, the system of FIG. 1 will oscillate at the chosen resonance points). Many types of frequency sensitive phase shifters may be used to accomplish the desired results in this system and one type of such phase shifter, more specifically, is an integratable delay means like that shown in FIG. 5, by way of illustration only, and discussed more fully in connection therewith. Such a delay line is a higly satisfactory means of performing the phase shifting operation of block 5 in FIG. 1 and the graphic results obtained therefrom are more fully discussed in connection with FIGS. 2, 3A and 3B below.

Figure 2:
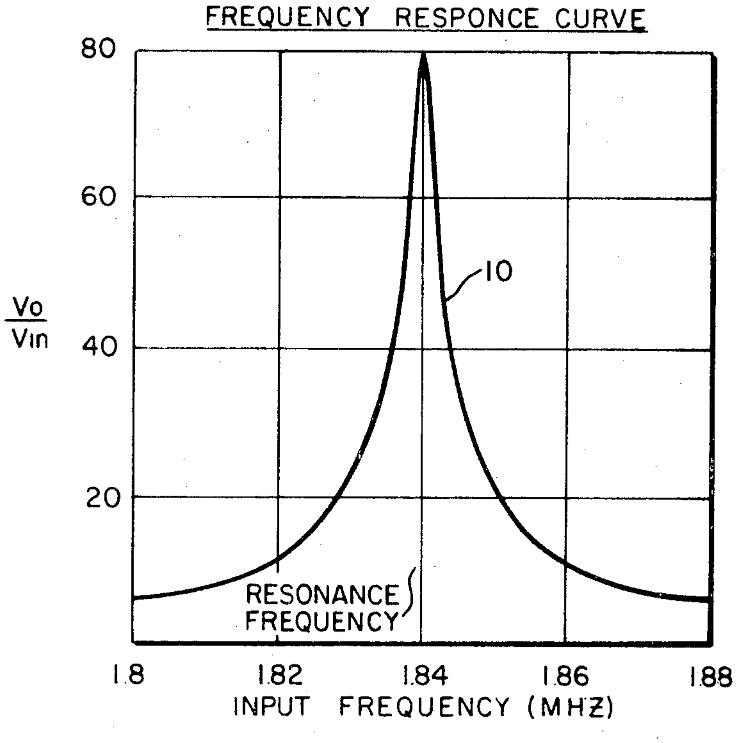
FIG. 2 is the Frequency Response Curve corresponding to one embodiment of the filter shown in FIG. 1, wherein the phase shifter 5 is a delay line.
Figure 3A:
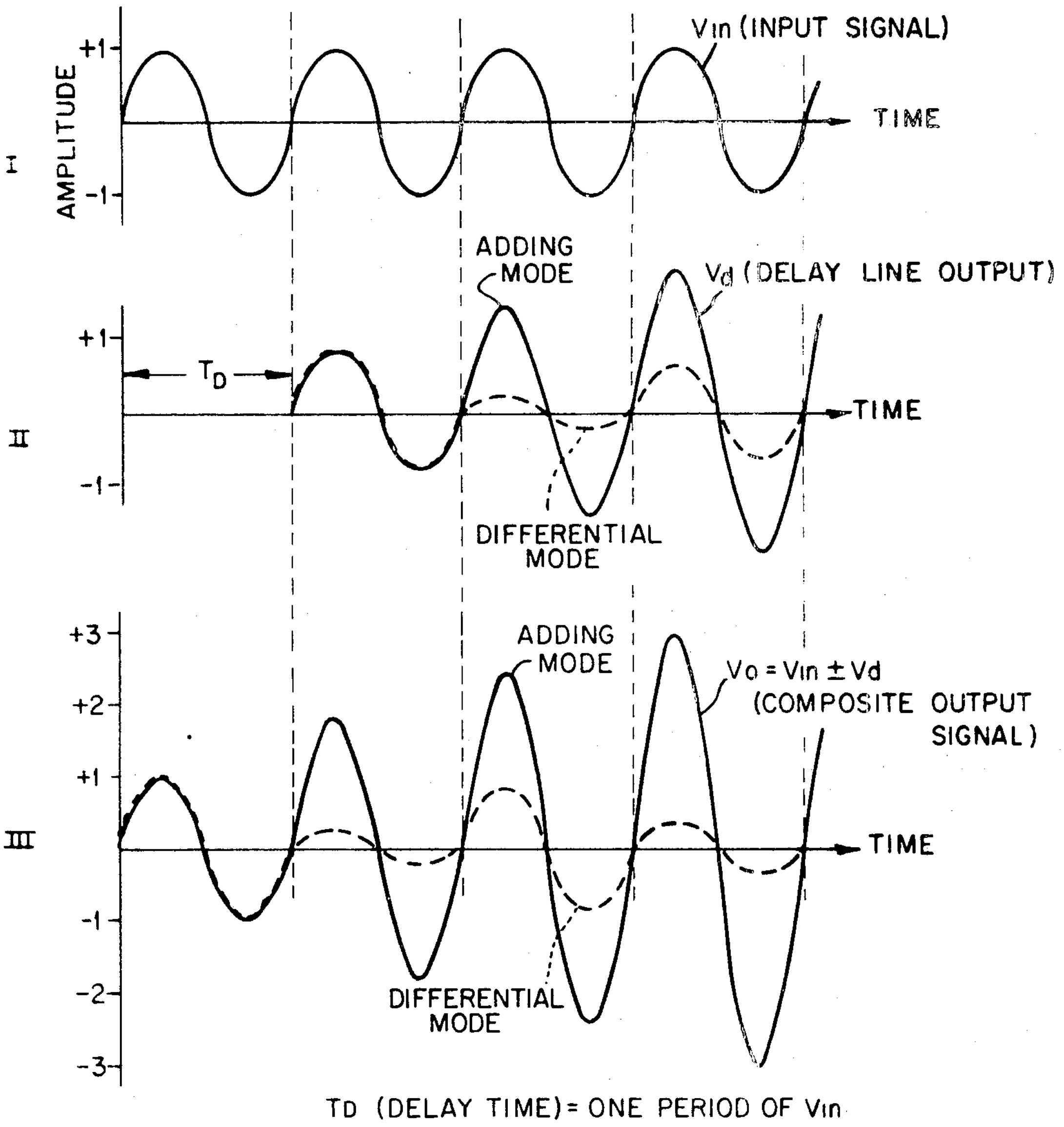
FIG. 3A is a graphical illustration of various signal wave forms in the system illustrated in FIG. 1 wherein the phase delay $T_D$ is equal to one period of the input voltage signal.

FIG. 2 shows a Frequency Response Curve 10 corresponding to a practical embodiment of the electronic filter shown in FIG. 1 using a delay line as the phase shifting component. The ordinate axis of the graph represents the ratio of $V_o/V_{in}$ while the abscissa represents the input frequency of $V_{in}$ in megahertz. Note that a sharp resonant frequency peak occurs at 1.84 megahertz and represents the resonant frequency of the filter system; that is, the predetermined frequency which this particular system is designated to pass. Note further that while $V_{in}$ is maintained constant that $V_o$ increases substantially as the input frequency approaches resonance from either a lower or higher value. The result of this is to produce a nearly symmetrical curve having good frequency selectivity at the resonant frequency. FIG. 3A and B explain in greater detail how the system shown in FIG. 1 functions to provide the Frequency Response Curve shown in FIG. 2.

FIG. 3A shows three sets of curves or graphs labelled I, II, and III, representing $V_{in}$ (input signal), $V_d$ (delay line output), and $V_{in} \pm V_d$ (composite output signal), respectively. The three sets of graphs each have respective ordinate and abscissas corresponding to amplitude and time, respectively. Graph I, respresenting $V_{in}$, shows the input sine wave signal passing through four successive cycles each having a period of ($T_D$). It should be noted that the input sine wave signal begins its first cycle at $t = 0$.

Referring now to Graph II (FIG. 3A), representing the signal $V_d$ appearing at the output of the amplifier-delay line combination 4–5, shown in FIG. 1, depending on whether the summer 3 shown in FIG. 1 is operating as an adder or a subtractor, the resulting curve representing $V_d$ will be in accordance with the solid line or the dotted line respectively. Note that the signal $V_d$ is delayed with respect to the output and input signals (III and I) by a time, $T_D$, which is the delay time of the delay line.

Graph III of FIG. 3A represents $V_o$ corresponding to the algebraic sum ($V_{in} \pm V_d$) or the composite output signal of the system. Again, it should be noted that when the summer 3 functions as an adder the solid line represents the composite signal while in the case where the summer 3 functions in a differential mode the dotted line represents the composite output signal.

Graph II and Graph III are obtained from Graph I in the following manner. The first full cycle of the input signal $V_{in}$ appears unaltered in phase and amplitude at terminal 2 as $V_o$. During this period $V_d$ is zero since nothing has arrived at this point due to the delay time, $T_D$. At the end of one period, the delayed signal $V_d$ finally appears. During the second half cycle of the input, the input sine wave $V_{in}$ and delayed sine wave $V_d$ add at every instant of time to produce the second cycle of the output waveform shown in Graph III. This cycle of output waveform again is delayed by $T_D$, and shows up in $V_d$ (slightly attenuated) coincident with the third cycle of the input wave form (Graph I). Again, the third cycle of the input waveform and the second cycle of the delayed signal $V_d$ add at every instant of time to produce the third cycle in the output waveform $V_o$. This process continues in a manner similar to that just described. Note, in Graph III, that each successive cycle of the output voltage either gets larger than the previous cycle due to the adding mode, or gets smaller than the previous cycle due to the differential mode, as the case may be. In this particular graph, the output waveform will grow to a steady-state value of five times the input voltage (representing resonance) for the adding mode, after some 10 cycles (or periods) of input waveform have elapsed. For the differential mode, the output waveform will become approximately one-half the input waveform (representing a null condition).

Figure 3B:
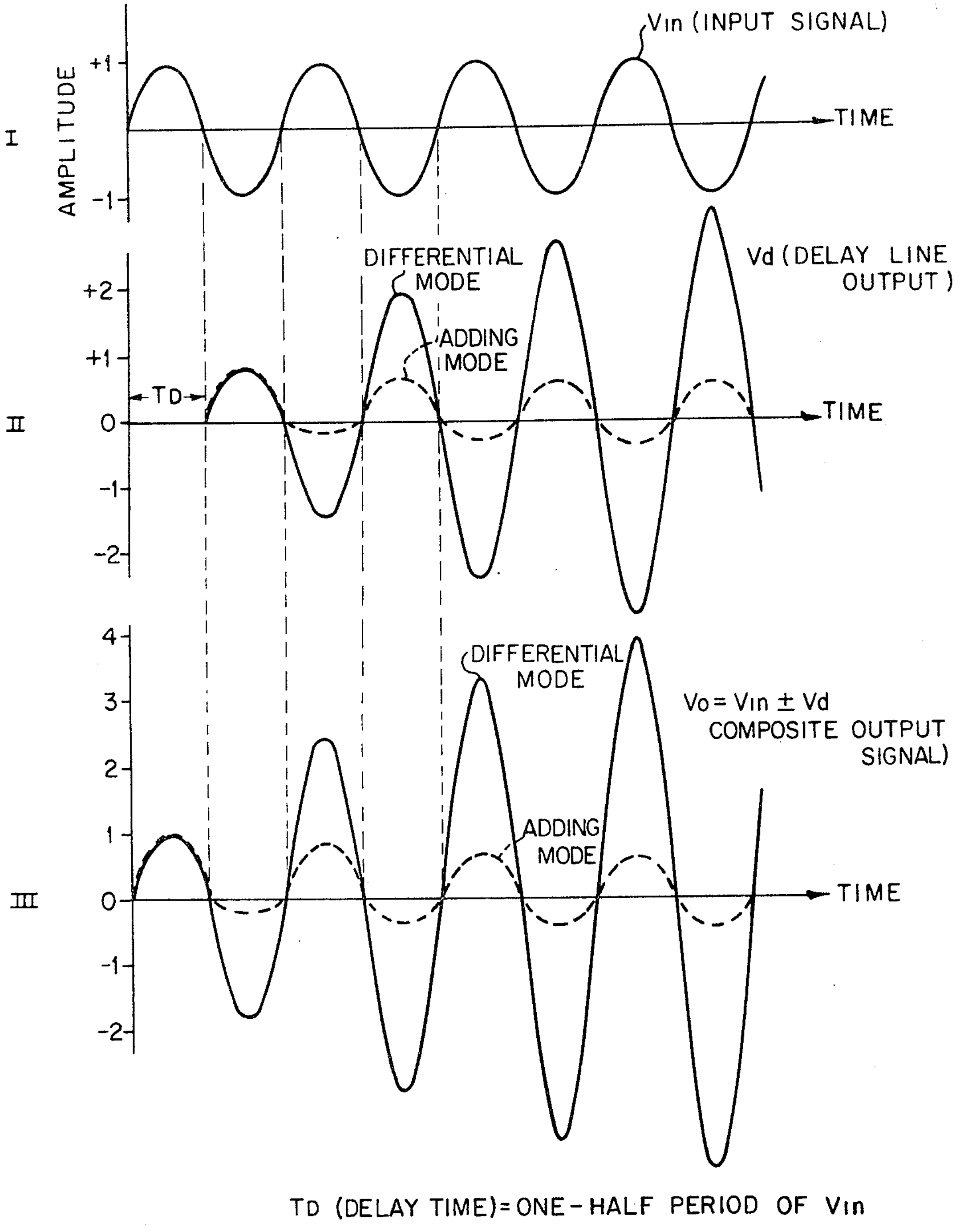
FIG. 3B is a graphical illustration of various signal wave forms in the system illustrated in FIG. 1 wherein the phase delay $T_D$ is equal to one-half period of the input voltage signal.

In the case of FIG. 3B, the delay time $T_D$ is only one-half a period. Essentially the same explanation given above in connection with FIG. 3A applies to Graphs I, II, and III shown in this Figure. However, in FIG. 3B the differential mode (solid line) resonates and the adding mode (dotted line) nulls out. Further difference in the Graphs shown in this Figure and those shown in connection with FIG. 3A include the differential mode resonance shown in Graph III of this figure where it is shown that it grows twice as fast as does the adding mode resonance shown in Graph III of FIG. 3A. That is, the transient response of the differential mode circuit is twice as fast as the adding mode. It is desirable to have $V_o$ grow as fast as possible to its steady-state (or final) amplitude.

It is evident from FIGS. 3(A) and 3(B) that the summing and differential modes of operation of FIG. 1 produce nearly identical filter action. The adding mode produces a resonance when the delayed signal, $V_d$, is 2 $\pi$ radians (full period) out of phase with the input signal, $V_{in}$, whereas the differential mode produces a resonance when $V_d$ is $\pi$ radians (half period) out of phase with $V_{in}$. In the differential mode, the minus (−) sign of summer 3 produces the equivalent of an additional $\pi$ radians of phase change so that each successive return signal ($V_d$) appears 2 $\pi$ radians out of phase with the preceding signal. Hence, except for certain elementary differences (i.e., transient response), the adding or subtracting operations performed by the summer 3 produce equivalent results.

It is evident from FIG. 1 that the total phase shift of 2 $\pi$ radians between successive signals cycled through the system can be achieved in a variety of different ways, thus in many practical systems some phase shift is produced in the amplifier or adder circuit at certain frequencies. In this case the amount of phase shift produced by the frequency sensitive phase shifter should be reduced in order to obtain a total phase shift of 2 $\pi$ radians at the desired frequency. It will be evident that selective reinforcement of the output will occur in all cases where the total phase shift of the three blocks of FIG. 1 is an integral multiple of 2 $\pi$ radians at the frequency to be selected.

Figure 4:
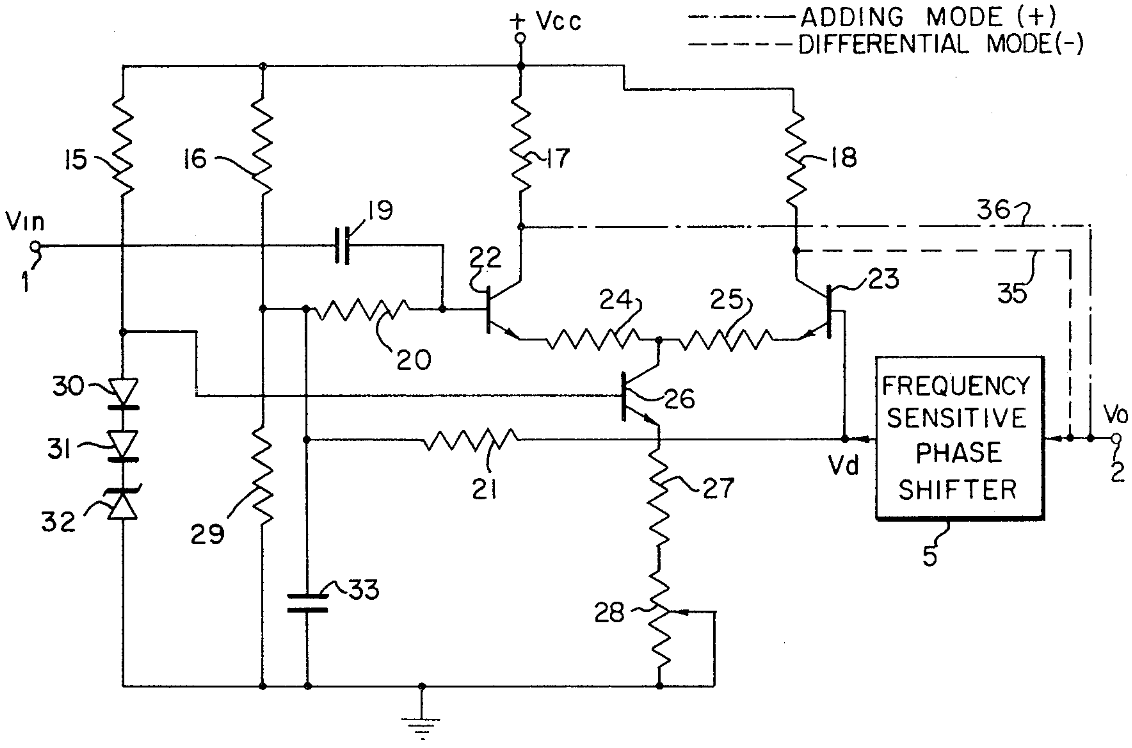
FIG. 4 is a circuit diagram illustrating a particular schematic arrangement of the electronic band-pass filter shown in FIG. 1.

FIG. 4 shows a particular circuit arrangement of a practical embodiment of the basic system depicted in FIG. 1. For clarity of explanation, the dash-dot-dash line 36 shows how the input of the frequency sensitive phase shifter 5 would be connected to operate in the adding mode, while the dash-dash line 35 illustrates how the input of the frequency phase shifter 5 would be connected to operate in a differential mode.

The remaining electrical circuitry represents the amplifier-summer combination 3–4. Starting to the left of the Figure, the input signal $V_{in}$ at terminal 1 is supplied to the input of the summer via DC blocking capacitor 19. It should be noted that the various components throughout the circuit diagram are discussed as they relate to the entire combination rather than in termas of what components act as the summer and what components act as the amplifier. The reason for this is that various components have interrelated functions which overlap into the summer and amplifier as such. This will become more readily apparent as the discussion below is read.

Resistor 15 is a current limiting resistor which limits the magnitude of the bias current to diodes 30, 31 and 32. Diode 32 is a zener diode which establishes a low voltage reference supply to the base of transistor 26. Diodes 30 and 31 are temperature compensating and act to maintain a constant voltage supply across resistors 27 and 28. Resistors 16 and 29 form a voltage divider to provide DC bias for transistors 22 and 23. Resistors 20 and 21 isolate the lases of transistors 22 and 23, respectively, from the junction point of the voltage divider resistor networks 16 and 29.

Capacitor 33 acts as an AC shunt or by-pass to drain off the AC component of current from the junction point of the voltage divider network 16 and 29. Transistors 22 and 23, in conjunction with resistors 24 and 25, form a differential pair to provide the adding or subtractive functions, depending on how the phase shifter input is connected to the summer. Resistors 17 and 18 are the collector load resistors of transistors 22 and 23, respectively. Transistor 26 acts as the common emitter current source for differential mode transistors 22 and 23. Resistor 27 and variable resistor 28 acts as an emitter biasing means whose function is to set the level of current supply to differential mode transistors 22 and 23 via transistor 26 and thereby adjust the voltage gain from the bases to collectors of 22 and 23. The AC signal occurring at the collector of transistor 22 is proportional to the AC signal, $V_d$, appearing at the base of transistor 23 minus the AC signal, $V_{in}$, appearing at the base of transistor 22. Likewise, the AC signal appearing at the collector of 23 is the AC signal, $V_{in}$, appearing at the base of transistor 22 minus the AC signal, $V_d$, appearing at the base of transistor 23. Hence, it can be seen that the summing circuit described above can be used in either the adding mode or the differential mode to provide resulting waveforms corresponding to those shown in connection with FIGS. 3A and B, respectively.

In theory, when the phase shifter 5 in FIG. 1 is a delay line, the system will produce resonances at many different frequencies, producing a "comb spectra." Specifically, the adding mode will resonate at every frequency such that the period is $T_D/n$, where $n = 0, 1, 2, 3$ – – –. Similarly, the differential mode will resonate at every frequency such that the period is $2T_D/(2n+1)$. Generally, it is desirable to suppress all spurious resonances for $n \neq 1$; in other words, allow only a single resonance of $f = 1/T_D$ or $f = 1/(2\ T_D)$ as the case may be. The frequency response $Vo/V_{in}$ (see FIG. 2) at a particular frequency is a strong function of how nearly equal $V_d$ is to $V_{in}$ at that frequency. As an example, for $Vo/V_{in}$ to equal 100 at resonance, $V_d$ must be 0.99 $V_{in}$; however, if $V_d = 0.90\ V_{in}$, $Vo/V_{in}$ is only 10. In practice, the amplifier 4 gain is adjusted to the desired gain at the first order resonance ($n$=1). Due to the natural frequency response of the summer 3 and amplifier 4 , the ratio of $V_d/V_{in}$ is relatively low at potential resonant frequencies other than the chosen first order resonance, and the spurious resonances ($n \neq 1$) are well suppressed. It should be noted that the resonances are, in practice, dependent on the total phase shift produced by the phase shifter 5 and amplifier 6, not just the phase shifter alone.

Figure 5:
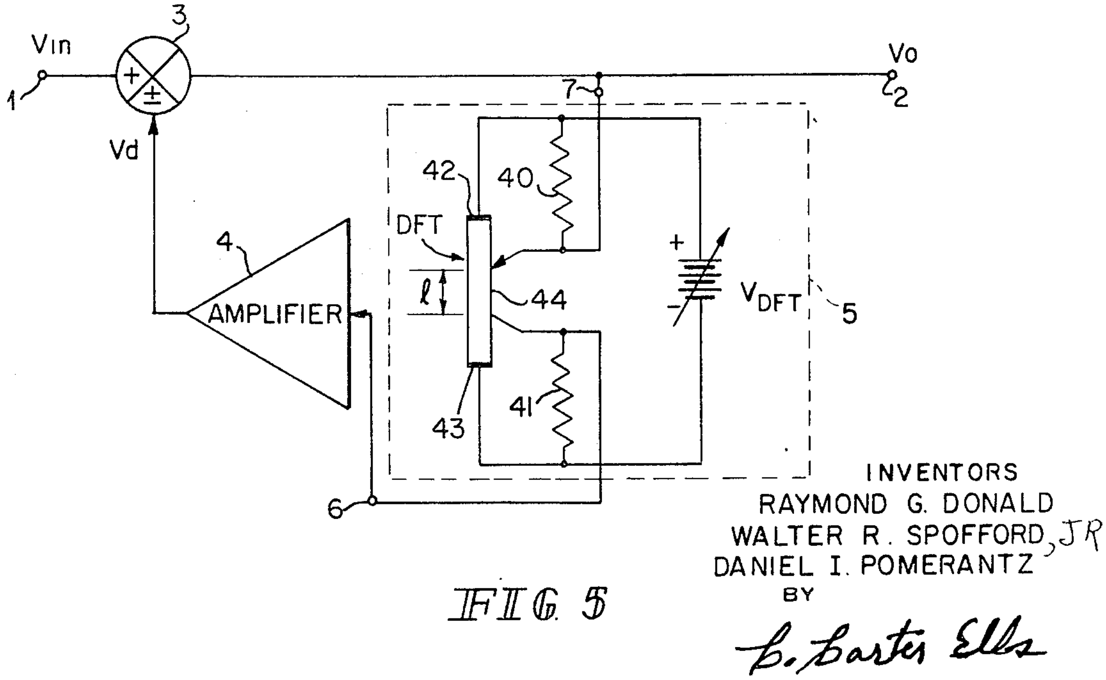
FIG. 5 is an illustration of a particular embodiment of the phase shifter 5 shown in the basic system of FIG. 1.

Referring to FIG. 5, there is shown a specific embodiment of an integratable phase-shift means which has been found to be a highly satisfactory means of practicing the basic electronic band-pass filter shown in FIG. 1. The Frequency Sensitive Phase Shifter means 5 is comprised of a drift field transistor (DFT) having ohmic conductor terminals 42 and 43 at each end of a length of doped semiconductor material 44, the operation of which will be more fully explained below. The drift field transistor (DFT) is a semiconductor device that acts as a time delay device (or delay line) as will be explained in more detail later in this paragraph. Resistors 40 and 41 provide biasing means for the emitter and collector, respectively, of the drift field transistor. $V_{DFT}$ is a variable voltage supply means which supplies a potential to the drift field transistor thereby creating an electric field along the length of semiconductor material 44. Minority carriers emitted at the emitter are swept towards the collector by this electric or "drift" field and collected. In FIG. 5, the semi-conductor bar 44 is depicted, for purposes of illustration, as N-type with P-type emitter and collector regions. The doping could be reversed. Resistor 40 forward biases the emitter junction, thereby causing the junction to inject a continuous (DC) current of minority carries into the bar 44. Due to the polarity of the drift field, these minority carriers are swept towards the collector, at a constant velocity proportional to the drift field magnitude. The collector is reverse biased by resistor 41. All minority carries which pass near the collector junction are swept across it. These collected carriers must pass through resistor 41, thereby causing a voltage drop across 41 which is proportional to the original level of carriers injected at the emitter. A time varying signal applied at 7 varies the amount of carriers injected from the quiescent value established by resistor 40. After travelling the length $l$, the same carriers are collected and produce an output signal at 6 which is proportional to the signal at 7, but time delayed. The amount of time required for the minority carriers to flow a distance $l$ between the emitter and the collector of the drift field transistor will be a function of, (1) the distance $l$ between the emitter and collector of the drift field transistor and (2) the value of the voltage supply indicated as $V_{DFT}$. In other words, for a given value of $V_{DFT}$, the time delay $T_D$ can be increased by increasing the distance $l$. Likewise, for a given distance $l$, the delay $T_D$ can be increased by lowering the voltage supply $V_{DFT}$. The remaining portion of this circuitry is identical to that shown in FIG. 1 and includes a summer 3 and amplifier 4. The various connections and terminals can be seen to be identical with that shown in FIG. 1. The use of a drift field transistor, such as that shown in connection with this Figure, provides a readily integratable phase shifter, more specifically, a delay means, having a given delay time interval ($T_D$) which can be varied in accordance with the value of $V_{DFT}$. For a more detailed discussion of the fundmental operation of a drift field transistor, reference is made to "Electrons and Holes in Semiconductors" by William Shockley, D. VanNostrand, 1950 pp 54–56.

Figure 6:
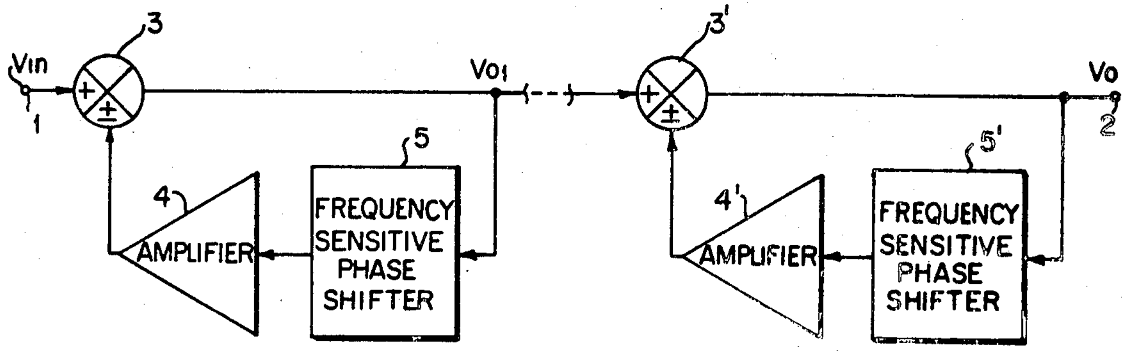
FIG. 6 is a block diagram of an alternate embodiment of the basic filter system shown in FIG. 1.

FIG. 6 shows the basic electronic band-pass filter embodied in FIG. 1, but further illustrates that such filters may be cascaded together (two or more). Cascaded filter sections allow various desirable functions to be accomplished. If each section of the cascade is adjusted to a gain of $G_o$ at the resonant frequency, $f_o$, then the overall gain at $f_0$ will be $G_o^N$, where N is the number of stages cascaded. For two stages, each adjusted to a gain of 100 at $f_0$, the overall gain would be $100^2 = 10,000$. The individual filter sections can be combinations of adding and differential mode circuits, in which case the spurious responses (unwanted) can be further suppressed. Furthermore, if various stages are tuned to slighly different frequencies from one another ("stagger tuned") various band-pass responses can result.

What is claimed is:

1. An electronic band-pass filter for selectively passing signals having a predetermined frequency comprising:

a. summing means for summing signals having an input for receiving signals to be filtered, said summing means having an output and one other input.

b. a phase shifting means comprising a drift field transistor comprising a doped semiconductor material having conductor terminals attached thereto and including emitter and collector junctions and biasing resistors threfore, and a variable vottage supply means between said conductor terminals, and c. amplifying means having an input connected to said collector, and an output connected to said other input of said summing means.

2. The electronic band-pass filter according to claim 1 wherein:

said summing means is operated in the addition mode.

3. The electronic band-pass filter according to claim 1 wherein:

said summing means is operated in the subtraction mode.

4. The electronic band-pass filter according to claim 3 wherein:

said drift field transistor is integrated and has a time delay period which is variable in accordance with the (1) geometrical distance between its emitter and collector, and (2) the value of the voltage supplied to or between the end terminals of said drift field transistor.

5. The electronic band-pass filter according to claim 1 wherein:

the electronic band-pass filter is comprised of several electronic band-pass filters substantially like that described in claim 1, said filters being connected in series so as to provide an output characteristic having improved frequency selectivity at the output of the last one of said filters.

* * * * *

UNITED STATES PATENT OFFICE
CERTIFICATE OF CORRECTION

Patent No. 3,742,259 Dated June 26, 1973

Inventor(s) R. G. Donald, W. R. Spoffard, Jr., D. I. Pomerantz

It is certified that error appears in the above-identified patent and that said Letters Patent are hereby corrected as shown below:

Col. 1, line 8, delete "nexpensive" and insert ---inexpensive---.

Col. 3, line 10, delete "designated" and insert ---designed---.

Col. 4, line 13, delete "difference" and insert ---differences---.

Col. 4, line 65, delete "term as" and insert ---terms---.

Col. 5, line 13, delete "lases" and insert ---bases---.

Col. 6, line 25, delete "carries" and insert ---carriers---.

Col. 6, line 30, delete "carries" and insert ---carriers---.

Signed and sealed this 27th day of November 1973.

(SEAL)
Attest:

EDWARD M.FLETCHER,JR.
Attesting Officer

RENE D. TEGTMEYER
Acting Commissioner of Patents